United States Patent [19]

Poulo

[11] Patent Number: 4,490,682

[45] Date of Patent: Dec. 25, 1984

[54] INSTRUMENTATION AMPLIFIER HAVING AUTOMATIC OFFSET ADJUSTMENT

[75] Inventor: Louis Poulo, Andover, Mass.

[73] Assignee: Analogic Corporation, Wakefield, Mass.

[21] Appl. No.: 330,905

[22] Filed: Dec. 15, 1981

[51] Int. Cl.³ .............................................. H03F 1/26
[52] U.S. Cl. ...................................... 330/9; 330/110; 330/259
[58] Field of Search .......................... 330/9, 110, 259; 328/162

[56] References Cited

U.S. PATENT DOCUMENTS 3,448,393 6/1969 Rice, Jr. ................................... 330/9
3,995,227 11/1976 Lefévre .................................... 330/9
4,229,703 10/1980 Bustin ................................... 328/162
4,356,450 10/1982 Masuda ........................... 330/259 X Primary Examiner—James B. Mullins
Attorney, Agent, or Firm—Weingarten, Schurgin, Gagnebin & Hayes

[57] ABSTRACT

An instrumentation amplifier having automatic offset error adjustment to null unwanted DC output signals. The DC gain of the instrumentation amplifier is first increased by reducing the internal negative feedback which increases the amplitude of unwanted DC signals; thereafter, an offset correction signal is provided to reduce the unwanted DC signals. The normal operating DC gain is restored and the unwanted DC output signal is further reduced.

5 Claims, 2 Drawing Figures

INSTRUMENTATION AMPLIFIER HAVING AUTOMATIC OFFSET ADJUSTMENT

FIELD OF THE INVENTION

The present invention relates to instrumentation amplifiers and more specifically to instrumentation amplifiers having automatic offset adjustments which compensate for DC offset errors.

BACKGROUND OF THE INVENTION

Instrumentation amplifiers having a DC response all suffer from the appearance of error or unwanted DC signals among their output signals, wherein some, if not all, of these error signals arise from non-linearities or imbalances within the amplifier. These imbalances, even if corrected, are subjected to changing environmental and electrical conditions wherein those corrections are no longer optimum. Typically, in commercially available instrumentation amplifiers which include operational amplifiers (the operational amplifiers having an output and a pair of inputs including an inverting input and a non-inverting input relative to the output), the balance of the input voltages and currents have the most significant effect in contributing to such error signals. The unwanted DC output signals may also arise from an external DC bias present on the amplifier input signals.

As mentioned above, varying operating conditions make static or one-time adjustments of the amplifier circuit inadequate for long term correction. Attempts have been made to stabilize the operating characteristics, such as incorporating thermal ovens to provide a uniform and constant thermal environment, and highly accurate voltage regulators to stabilize the necessary power supply voltages and currents. Even when such measures are implemented, there will always remain a significant error component within the output signal. One approach shown in prior art techniques is to remove the input signal to the operational amplifier and to measure the output signal of the operational amplifier relative to a threshold or reference point, typically the ground or common terminal of the amplifier system. The difference signal is then fed back and added to at least one of the operational amplifier inputs to reduce this difference signal. In this way the operational amplifier error output signal is adjusted to zero volts. The operational amplifier input signal is reapplied and the correction signal is maintained at the previously selected level by analog or digital storage means. These storage means may include a large storage capacitor either used independently or in an integrator-type circuit or may be a digital circuit comprising a register providing a correction signal represented by the binary value of the register which, when converted by a digital-to-analog converter to an analog signal, provides the appropriate correction voltage to the operational amplifier input. This technique is limited by the resolution of the comparison means to measure the output signal from the operational amplifier relative to the reference point, and the storage means to provide a definable correction voltage which provides a suitably accurate correction signal to the operational amplifier input.

SUMMARY OF THE PRESENT INVENTION

The present invention includes an operational amplifier having a frequency response including DC, an adjustable feedback network and an offset adjustment means which includes a signal comparator to measure the output signal relative to a reference signal. The offset adjustment means is periodically engaged to correct for the operational amplifier offset error signals, simultaneously with removing the amplifier input signal and adjusting the feedback network to allow the operational amplifier to operate at a higher DC gain level. The reduced feedback magnifies the error signals which are thereby more precisely correctable by the offset adjustment means. The offset correction signal is then stabilized, the normal level of feedback is restored, and the amplifier input signal is reestablished.

The operational amplifier and the feedback network may also include additional functional elements having their own specific transfer characteristics, to provide a desired transfer characteristic of the entire system. This transfer characteristic may include that of a low pass filter, having response down to DC.

The comparator typically measures the output voltage referred to the common or ground point and provides a bistable output whenever the output voltage substantially exceeds that of the ground reference point. When that occurs, the comparator changes state to enable a digital clock signal to be received by a binary digital counter. The counter has a plurality of output signals corresponding to a sub-multiple of the counter (clock) input, each being a different successive power of two. The counter output signals are received by a resistive ladder and voltage divider network which provides a variable offset correction voltage according to the digital clock signal and the duration of the clock signal. Coincident with the digital clock signal, the feedback network, including a switchable resistive voltage divider, is operative to reduce the level of DC negative feedback, permitting the operational amplifier to operate at a higher DC gain, which in turn magnifies the contribution of input error signals in the amplifier output signal. After the offset error is minimized, the feedback network is switched to the normal level to return the instrumentation amplifier to its normal operational mode.

DESCRIPTION OF THE DRAWING

These and other features of the present invention are more fully described in the following detailed description and in the accompanying drawing in which.

DETAILED DESCRIPTION OF THE INVENTION

Figure 1:
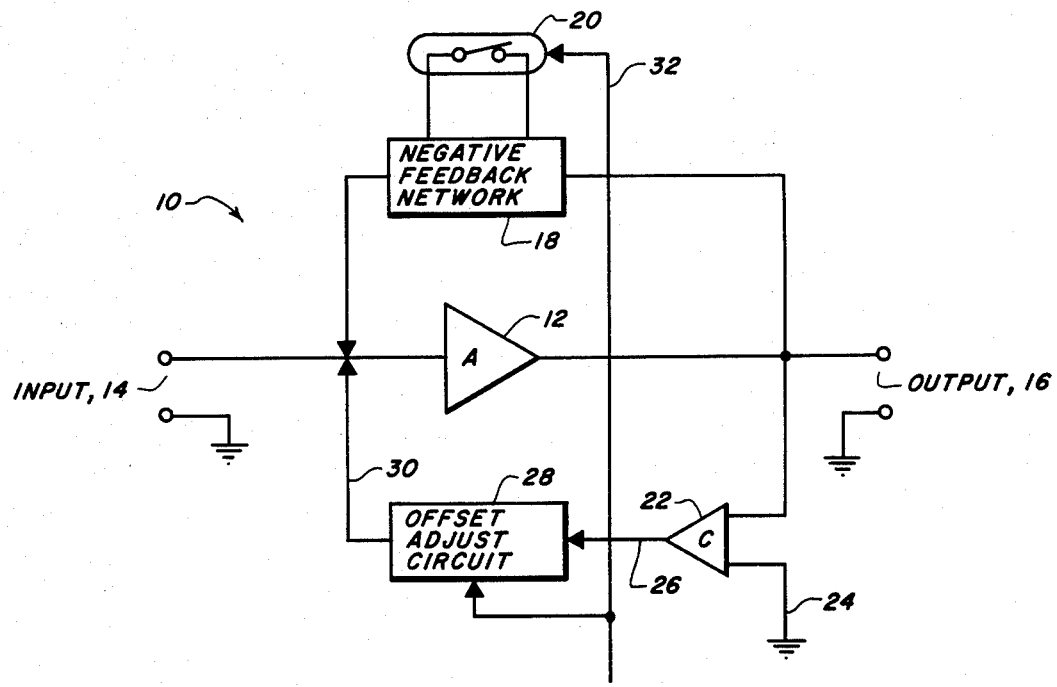
FIG. 1 is a function block diagram according to one embodiment of the present invention.

The instrumentation amplifier block diagram is shown in FIG. 1 wherein the instrumentation amplifier includes the operational amplifier 12 receiving an input signal at input terminals 14 and providing an output at the output terminals 16. The amplifier 12 comprises an operational amplifier wherein the feedback network 18 determines to a substantial amount the transfer characteristics of the instrumentation amplifier circuit between the input 14 and the output 16. The feedback network 18 contains a feedback adjustment device 20 shown simply as a switch connected to the feedback network 18. When the offset error is to be corrected, the input 14 of the instrumentation amplifier 10 is placed in a no-signal or quiescent state so that any signal obtained at the output 16 will include only that of error sources within the instrumentation amplifier 10. The feedback network 18 is altered by the device 20 in a manner which reduces the amount of feedback signal to increase the overall instrumentation amplifier DC gain. The effect of the device 20 on the negative feedback network 18 should not substantially affect the resistance and impedence characteristics of that negative feedback network, as measured at the inverting amplifier input 14 and at the amplifier 12 non-inverting input terminals. The instrumentation amplifier output at 16 is compared by comparator 22 to a reference point, typically a common ground 24. The comparator means 22 provides an enable output at 26 which is received by an offset adjustment circuit 28 which provides an offset adjustment output 30 to be received by the operational amplifier 12 at its input. The negative feedback network adjusting device is actuated by a control signal 32 which is operated by the same offset adjustment control signals as is the offset adjustment circuit 28. The feedback adjustment device 20 is operated so as to reduce the negative feedback around the operational amplifier 12 in a manner to increase the DC gain. Coincidental with this action, the output at 16 is measured by comparator 22 relative to the desired quiescent operating point, typically the zero or ground level, and provide an output 26 which indicates whether or not the output equal substantially the zero output level at common ground desired under quiescent conditions. When such conditions are not met, the comparator 22 provides an enable signal at 26 which is received by the offset adjustment circuit 28. When the enable signal at 26 coincides with an offset adjustment control signal is received at 32, the offset adjustment circuit operates to provide a signal 30 which operates to reduce the output error voltage. The offset adjustment circuit automatically operates to reduce the output error voltage to the greatest extent possible as determined by the selection of components therein. Subsequently, the offset adjust control signal is removed and the input signal is now restored to normal operating levels. The output signal thereafter is substantially free of offset error signals, containing substantially only the input signals as amplified by the operational amplifier 12.

Figure 2:
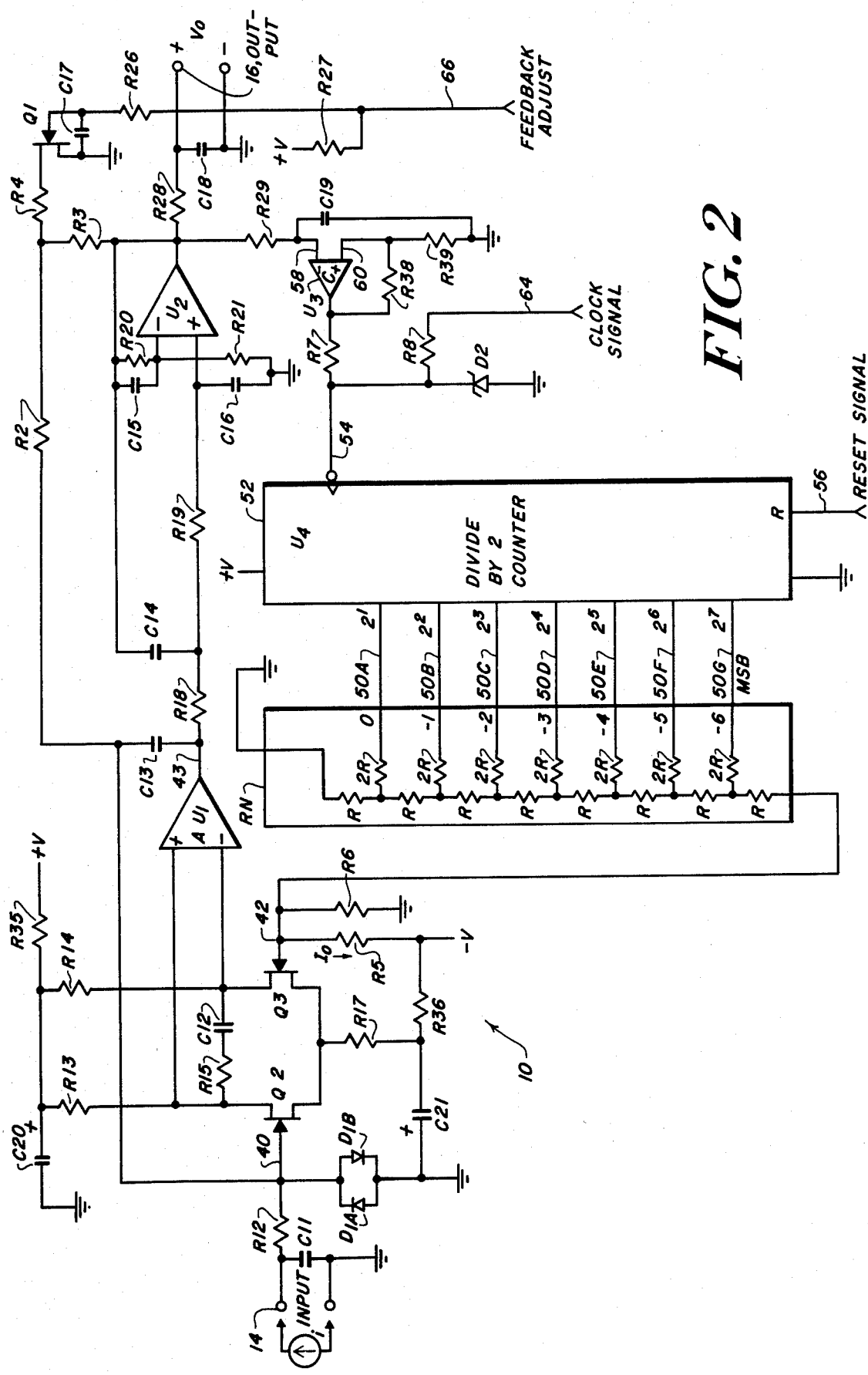
FIG. 2 shows a detailed schematic diagram of the circuit of FIG. 1.

Turning now to FIG. 2, showing a further detailed embodiment of one form of the present invention, discussed above. The input at terminals 14 is received by the instrumentation amplifier 10 which includes two inputs, one being an inverting input 40 and the second being a non-inverting input 42, and an output at terminals 16 responding to the inputs 40 and 42, wherein the output at 16 will be substantially equal to zero volts when the inputs 40 and 42 receive substantially equal voltage and current signal values. The instrumentation amplifier 10, operated to provide a voltage output relative to a current input, further includes components which form a specific transfer characteristic, or more precisely, a low pass filter as shown here. At the inverting input 40, input resistor R12 forms a resistive current limiting and voltage limiting network together with diodes D1a and D1b so that excessive voltages applied to the input terminals 14 do not damage subsequent components within the operational amplifier and instrumentation amplifier shown. The non-inverting input is used to receive offset correction signals derived within the instrumentation amplifier 10, explained below. The input signals at 40 and 42 are received thereafter by field effect (FET) input transistor Q2 operationally balanced with transistor (FET) Q3 to form a differential amplifier pair. The source terminals of transistors Q2 and Q3 are connected through resistor R17 which provides desired source coupling to balance the signal between transistors Q2 and Q3, and is connected to a negative voltage source through resistor R36 as bypassed by capacitor C21. The drains of the transistors Q2 and Q3 are connected to a positive voltage through load resistors R13 and R14, respectively. The load resistors are then connected to the positive voltage source through resistor R35 and by-passed by capacitor C20. The drains of the transistors Q2 and Q3 are connected to the non-inverting and the inverting inputs, respectively, of operational amplifier U1. The amplifier U1 in conjunction with FET transistors Q2 and Q3 form a high input impedance operational amplifier around which feedback is applied by capacitor C13 and outer loop feedback resistor R2, to contribute to the overall instrumentation amplifier 10 transfer characteristic. The gate of the transistor Q3 is connected to an adjustable voltage source formed by resistor ladder network RN in parallel with resistor R6 and in conjunction with resistor R5 connected to the minus voltage supply and binary digital counter U4. The amplifier U1 includes an output connected to amplifier U2 through resistors R18 and R19 and in conjunction with capacitor C14, C15 and C16 and resistor R23. The amplifier U2 provides the output to the instrumentation amplifier 16 through resistor R28 and across capacitor 18.

Resistors R2 and R3 comprise the instrumentation amplifier feedback network in the normal operating condition. The resistor R3, being substantially smaller by several orders of magnitude than resistor R2 contributes little to the characteristics except when the instrumentation amplifier is operated with reduced feedback. When the feedback network is operated in offset correction mode having reduced feedback, the third resistor R4 and transistor Q1, operates to form a voltage divider comprising R3 and R4 to substantially reduce the feedback signal at junction of R2, R3 and R4, thus reducing the feedback current produced by R2 to the input at 40. The feedback is reduced by effectively connecting one end of R4 to ground through FET Q1 which, when turned on, operates as a substantially low value resistor and corresponds to the feedback adjustment device 20 shown in FIG. 1. The transistor Q1 is operated by a gate voltage shift between desired voltage ranges according to known FET switching techniques; the gate voltage is provided by offset adjustment control signals, not shown.

The output of amplifier U2 is measured in reference to common ground by comparator U3, corresponding to comparator 22 of FIG. 1, which produces a high impedance output whenever the U2 output is less than common ground and a negative voltage is produced at the comparator output whenever the output voltage from U2 is greater than the common ground or zero volts. The comparator U3 also includes a negative and a positive or inverting and non-inverting inputs 58 and 60, respectively. Resistors R38 and R39 are connected to provide a limited amount of positive feedback around the comparator U3, to provide a margin of noise immunity, according to known procedures. A sequence of clock pulses on lead 64, preceeded by a counter reset signal at 56, together with reduction of feedback by feedback adjustment signal on lead 66 which together comprise the offset adjustment mode, occurs periodically to maintain a corrected output signal at 16 as operating conditions change. The clock signal input received on lead 64 comprises a sequence of pulses which swing between a positive and a negative voltage substantially equal in magnitude to the swing of the output of comparator U3. Therefore, when the output of comparator U3 is in a high impedance state (output 16 being below ground) and clock input is equal to approximately zero volts (or the low state), the resulting voltage at the counter U4 clock input, at the junction between R7 and R8, is zero volts. When the clock signal swings to a positive voltage, the counter U4 input then rises to a positive voltage as well. Conversely, when the comparator output is in a negative voltage mode (output 16 above ground), a positive clock signal at 64 in combination with resistors R7 and R8 produce a counter input no greater than zero volts. When the clock input at 64 is at zero volts, the voltage at the counter U4 input is limited by diode D2 to less than a volt. At the beginning of the offset correction mode and immediately before application of the clock signal, the divide by $2^N$ counter U4 (here shown as a divide by $2^7$ counter typically a commercially available integrated circuit number CD4024) receives a reset signal derived by external control means (not shown) applied to set all counter U4 outputs to a zero or beginning state. Thereafter, the number of clock signal pulses received by the counter U4 is equal to N, in this case 128, so that the divide by N counter does not roll over after N (128) pulses and start once again at zero. The corresponding seven digital output lines are connected to resistive ladder RN whose resistance decreases according to the increasing binary number received from the divide by $2^7$ counter U4. The network RN is a standard, commercially available R-2R ladder, which were connected to the digital output of counter U4 (having 0 v and +12 v states) provides a linearly increasing current output according to an incremented binary signal on lines 50A–50G. The resistor ladder network RN in parallel and resistor R6 forms a voltage divider producing the offset adjustment voltage received by non-inverting input 42. The resistor ladder and the parallel resistor R6 are substantially small in resistance and impedance so that the variation of the resistor ladder RN does not substantially change the impedance thereof. The resistor R5 biases the resulting offset voltage so that when the counter U4 is reset to zero, the voltage at 42 is at a negative voltage. As the counter is incremented from a minimum to a maximum value, the offset voltage rises through zero to a positive voltage.

The reset signal, clock signal and feedback adjust control signals may be manually adjusted, operated by discrete dedicated logic, or by computer output signals as desired in accordance to techniques known in the art of analog and digital signal control. The necessary conditions of operation are simply that the reset signal precede the clock signal, the feedback adjust signal enable the transistor Q1 to conduct during the time of the clock signal pulse sequence, and that the clock signal pulse sequence comprise of at least the number of pulses necessary to increment the counter over its operable range, typically N where N is the number of counter U4 states used. Coincidental with the operation of the clock signal and the feedback adjust control signal, it is desirable to suppress or reduce the normal input signal at input terminals 14 to allow the instrumentation amplifier 10 to be adjusted to an accurate level. After the clock signal of N pulses has been provided, the feedback adjust control and the clock signal return to quiescent or inactive states. the instrumentation amplifier is now properly adjusted for minimal DC offset error signal and is ready for normal operation.

In the embodiment shown in FIG. 2, the instrumentation amplifier has a low-pass filter characteristic formed substantially by resistors R2, R18, R19, R20 and R21 and capacitors C13, C14, C15, C16 and C18 in a manner known to filter design. During the feedback adjustment mode, the low pass filter characteristic is not necessarily maintained. However, since the normal operating input signal applied to 14 will typically be suppressed during that time period, alterations of AC characteristics will not be objectionable.

These and other embodiments according to the present invention made by those skilled in the art are within the scope of the invention, which is not to be limited to what has been describe except as defined by the appended claims.

What is claimed is:

1. An instrumentation amplifier including an input and an output having the characteristic of reduced DC offset error signals, said instrumentation amplifier being operable in a normal mode and in an offset adjustment mode according to an externally generated mode control signal, said instrumentation amplifier comprising:
   an amplifier of predetermined gain having an input and an output corresponding respectively to said instrumentation amplifier input and output further comprising a plurality of amplifier elements arranged to have a serial signal flowpath;
   a plurality of feedback paths, each at least around one of said plurality of amplifier elements wherein at least one said plurality of feedback paths is selected to provide a low-pass filter characteristic for said instrumentation amplifier;
   a negative feedback network connected between said instrumentation amplifier input and output, said network being controllable according to said mode control signal to reduce the negative feedback produced thereby when in the offset adjustment mode;
   comparator means connected to said amplifier output and a common reference point producing a comparator output signal whenever said DC offset error signal does not substantially equal zero volts relative to said common reference point;
   offset adjustment means receiving said mode control signal and said comparator output signal and having an output connected to said amplifier input, wherein said offset adjustment means provides an offset adjustment signal upon the occurrence of said comparator output signal and said mode control signal in the offset adjustment mode, said offset adjustment signal reducing said DC offset error signal relative to said common reference point, whereby said DC offset error signal is further reduced when the instrumentation amplifier is returned to the normal mode, said offset adjustment means further comprising:
   a digital counter receiving a periodic clock signal controlled by said mode control signal, said digital counter having a digital output related to a submultiple of said clock signal;
   a voltage reference; and
   a resistor network connected to said voltage reference and said digital output providing said offset signal.

2. The instrumentation amplifier of claim 1, wherein said amplifier input includes an inverting input and a non-inverting input, said negative feedback network being connected to said inverting input and said offset signal being received by said noninverting signal.

3. The instrumentation amplifier of claim 2 wherein said digital counter further comprises a reset input to receive a reset signal generated when the instrumentation amplifier is initially placed in offset adjustment mode to reset said digital counter output thereby reducing said offset adjustment signal to a minimum value, said digital counter being subsequently operated to increase said offset adjustment signal from a minimum value.

4. The instrumentation amplifier of claim 1, wherein said feedback adjustment means includes a switchable voltage divider receiving said mode signal, whereupon activation of said mode control signal said negative feedback is reduced.

5. The instrumentation amplifier of claim 4 wherein said switchable voltage divider includes a field-effect transistor.

* * * * *